(12) United States Patent
Hilali et al.

(10) Patent No.: US 8,338,209 B2
(45) Date of Patent: *Dec. 25, 2012

(54) PHOTOVOLTAIC CELL COMPRISING A THIN LAMINA HAVING A REAR JUNCTION AND METHOD OF MAKING

(75) Inventors: Mohamed M. Hilali, Sunnyvale, CA (US); Christopher J. Petti, Mountain View, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 400 days.

This patent is subject to a terminal disclaimer.

(21) Appl. No.: 12/189,158

(22) Filed: Aug. 10, 2008

(65) Prior Publication Data

US 2010/0032007 A1   Feb. 11, 2010

(51) Int. Cl.
*H01L 21/00* (2006.01)
*H01L 31/00* (2006.01)

(52) U.S. Cl. .......................... 438/57; 136/255

(58) Field of Classification Search .................. 136/255; 438/68, 57

See application file for complete search history.

(56) References Cited

U.S. PATENT DOCUMENTS

| | | | |
|---|---|---|---|
| 4,084,985 A | 4/1978 | Evans, Jr. | |
| 4,338,481 A | 7/1982 | Mandelkorn | |
| 4,451,970 A | 6/1984 | Izu et al. | |
| 4,496,788 A | 1/1985 | Hamakawa et al. | |
| 4,514,579 A | 4/1985 | Hanak | |
| 5,057,163 A | 10/1991 | Barnett et al. | |
| 5,164,019 A | 11/1992 | Sinton | |
| 5,374,564 A | 12/1994 | Bruel | |
| 5,956,571 A * | 9/1999 | Yang | 438/69 |
| 6,146,979 A | 11/2000 | Henley et al. | |
| 6,331,208 B1 * | 12/2001 | Nishida et al. | 117/89 |
| 6,340,788 B1 * | 1/2002 | King et al. | 136/261 |
| 6,429,037 B1 * | 8/2002 | Wenham et al. | 438/57 |
| 6,500,690 B1 * | 12/2002 | Yamagishi et al. | 438/57 |
| 6,825,104 B2 | 11/2004 | Horzel et al. | |
| 2003/0134489 A1 * | 7/2003 | Schwarzenbach et al. | 438/458 |
| 2006/0097259 A1 | 5/2006 | Suezaki et al. | |

(Continued)

FOREIGN PATENT DOCUMENTS

JP   2000349319   12/2000

(Continued)

OTHER PUBLICATIONS

Bergmann, R.B. et al., "Thin film solar cells on glass by transfer of monocrystalline Si films", 1999, International Journal of Photoenergy, vol. 1, pp. 1-5.*

(Continued)

*Primary Examiner* — Basia Ridley
*Assistant Examiner* — Tamir Ayad
(74) *Attorney, Agent, or Firm* — The Mueller Law Office, PC

(57) ABSTRACT

Fabrication of a photovoltaic cell comprising a thin semiconductor lamina may require additional processing after the semiconductor lamina is bonded to a receiver. To minimize high-temperature steps after bonding, the p–n junction is formed at the back of the cell, at the bonded surface. In some embodiments, the front surface of the semiconductor lamina is not doped or is locally doped using low-temperature methods. The base resistivity of the photovoltaic cell may be reduced, allowing a front surface field to be reduced or omitted.

7 Claims, 6 Drawing Sheets

U.S. PATENT DOCUMENTS

| | | | |
|---|---|---|---|
| 2007/0141803 A1* | 6/2007 | Boussagol et al. | 438/455 |
| 2007/0235074 A1* | 10/2007 | Henley et al. | 136/252 |
| 2007/0277874 A1 | 12/2007 | Dawson-Elli et al. | |
| 2008/0070340 A1 | 3/2008 | Borrelli et al. | |

FOREIGN PATENT DOCUMENTS

| | | |
|---|---|---|
| JP | 2003017723 | 1/2003 |

OTHER PUBLICATIONS

M.D. Abbott et al., "N-Type BiFacial Solar Cells with Laser Doped Contacts", IEEE, Mar. 2006, pp. 988-991.

S. Bandopadhyay et al., "Nickel Silicide Contact for Silicon Solar Cells", Bull. Mater. Sci., vol. 15, No. 5, Oct. 1992, pp. 473-479.

D.L. Meier et al, "Aluminum Alloy Back p-n Junction Dendritic Web Silicon Solar Cell", Solar Energy Materials & Solar Cells 65., 2001, pp. 621-627.

U.S. Appl. No. 12/026,530, filed Jul. 28, 2008, entitled "Method to Form a Photovoltaic Cell Comprising a Thin Lamina".

U.S. Appl. No. 12/057,265, filed Jul. 28, 2008, entitled "Method to Form a Photovoltaic Cell Comprising a Thin Lamina Bonded to a Discrete Receiver Element".

U.S. Appl. No. 12/057,274, filed Jul. 21, 2008, entitled "Photovoltaic Assembly Including a Conductive Layer Between a Semiconductor Lamina and a Receiver Element".

U.S. Appl. No. 12/122,108, filed May 16, 2008, entitled "Ion Implantation for Photovoltaic Cell Fabrication".

U.S. Appl. No. 12/130,241, filed May 30, 2008, entitled "Asymmetric Surface Texturing for Use in a Photovoltaic Cell and Method of Making".

Engelhart et al., "Laser Ablation of Passivating SINx Layers for Locally Contacting Emitters of High-Efficiency Solar Cells", IEEE, Mar. 2006, pp. 1024-1027.

S.W. Glunz et al., "New Concepts for the Front Side Metallization of Silicon Solar Cells", 21st European Photovoltaic Solar Energy Conference, Sep. 4-8, 2006, pp. 746-749.

A. Grohe et al., "Laser Processes for the Industrial Production of High Efficiency Silicon Solar Cells", 22nd European Photovoltaic Solar Energy Conference, Sep. 3-7, 2007, pp. 1751-1754.

A. Grohe et al., "Selective Laser Ablation of Anti-Reflection Coatings for Novel Metallization Techniques", IEEE, Mar. 2006, pp. 1399-1402.

Kerr, Mark J. et al., "Recombination at the Interface Between Silicon and Stoichiometric Plasma Silicon Nitride", Semicond. Sci. Technol. 17, Jan. 10, 2002, pp. 166-172.

R. Kopecek et al., "Large Area Screen Printed N-Type Silicon Solar Cells with Rear Aluminum Emitter: Efficiencies Exceeding 16%", IEEE, Mar. 2006, pp. 1044-1047.

Kerr, Mark John, "Surface, Emitter and Bulk Recombination in Silicon and Development of Silicon Nitride Passivated Solar Cells", Thesis submitted for the degree of Doctor of Philosophy of the Australian National University, Jun. 2002, 233 pages.

A. Mette et al., "Increasing the Efficiency of Screen-Printed Silicon Solar Cells by Light-Induced Silver Plating", IEEE, Mar. 2006, pp. 1056-1059.

Schmiga, Christian et al., "19% Efficient n-Type Czochralski Silicon Solar Cells with Screen-Printed Aluminum-Alloyed Rear Emitter", Progress in Photovoltaics: Research and Applications, Aug. 2006, pp. 533-539.

International Search Report and Written Opinion for International (PCT) Patent Application No. PCT/US2009/052020, mailed Jan. 12, 2010.

Poortmans, Jef et al., "Thin film solar cells: fabrication, characterization and applications", 2006, John Wiley & Sons Ltd., p. 72.

Office Action dated Apr. 1, 2010 for U.S. Appl. No. 12/189,157.

International Preliminary Report on Patentability and the Written Opinion file on Feb. 24, 2011 for PCT Patent Application PCT/US2009/052020.

Office Action dated Apr. 5, 2011 for U.S. Appl. No. 12/189,157.

Office Action dated Mar. 21, 2011 for U.S. Appl. No. 12/189,156.

Office Action dated Mar. 22, 2011 for U.S. Appl. No. 12/189,159.

Rinke, T.J., et al., "Quasi-monocrystalline silicon for thin-film devices", May 1999, Applied Physics A, DOI 10.1007/s003399900078 , pp. 705-707.

Notice of Allowance dated Nov. 14, 2011 for U.S. Appl. No. 12/189,157.

Office Action dated Aug. 24, 2011 for U.S. Appl. No. 12/189,157.

Office Action dated Sep. 2, 2011 for U.S. Appl. No. 12/189,156.

* cited by examiner

Embodiment of 12/026530

Embodiment of 12/026530

Embodiment of 12/026530

Embodiment of 12/026530

PHOTOVOLTAIC CELL COMPRISING A THIN LAMINA HAVING A REAR JUNCTION AND METHOD OF MAKING

RELATED APPLICATIONS

This application is related to Herner et al., U.S. patent application Ser. No. 12/189,156, "Method to Mitigate Shunt Formation in a Photovoltaic Cell Comprising a Thin Lamina," and to Herner et al., U.S. patent application Ser. No. 12/189,159, "A Photovoltaic Module Comprising Thin Laminae Configured to Mitigate Efficiency Loss Due to Shunt Formation," both filed on even date herewith and owned by the assignee of the present application, and both hereby incorporated by reference.

This application is also related to Hilali et al., U.S. patent application Ser. No. 12/189,157, "Photovoltaic Cell Comprising a Thin Lamina Having Low Base Resistivity and Method of Making," filed on even date herewith, owned by the assignee of the present application, and hereby incorporated by reference.

BACKGROUND OF THE INVENTION

The invention relates to a method to form an efficient photovoltaic cell while minimizing fabrication costs.

For some fabrication techniques, it may be useful to minimize processing temperature during later stages of fabrication. Many standard steps performed during fabrication of photovoltaic cells, such as diffusion doping and oxidation, require high temperature.

There is a need, therefore, to form the structures of a photovoltaic cell while minimizing temperature.

SUMMARY OF THE PREFERRED EMBODIMENTS

The present invention is defined by the following claims, and nothing in this section should be taken as a limitation on those claims. In general, the invention is directed to a photovoltaic cell comprising a thin lamina having a p-n junction at the back of the cell. In some aspects of the invention, the resistivity of the base region of the cell may be reduced below conventional levels.

A first aspect of the invention provides for a photovoltaic cell comprising a semiconductor lamina, the semiconductor lamina having a front surface and a back surface, wherein incident light enters the semiconductor lamina at the front surface during normal operation of the photovoltaic cell, the body of the semiconductor lamina is doped to a first conductivity type, the back surface of the semiconductor lamina is heavily doped to a second conductivity type opposite the first conductivity type, and no more than ten percent of the surface area of the front surface of the semiconductor lamina is doped more heavily to the first conductivity type than the lamina body.

An embodiment of the invention provides for a method for making a photovoltaic cell, the method comprising: providing a donor wafer doped to a first conductivity type; doping a first surface of the donor wafer to a second conductivity type opposite the first conductivity type; defining a cleave plane within the donor wafer; affixing the first surface of the donor wafer to a receiver element; cleaving a semiconductor lamina from the donor wafer at the cleave plane wherein the semiconductor lamina remains affixed to the receiver element; and completing fabrication of the photovoltaic cell, wherein the photovoltaic cell comprises the semiconductor lamina.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIG. 4a is a plan view, while FIG. 4b shows a cross-sectional view.

DETAILED DESCRIPTION OF THE PREFERRED EMBODIMENTS

Figure 1:
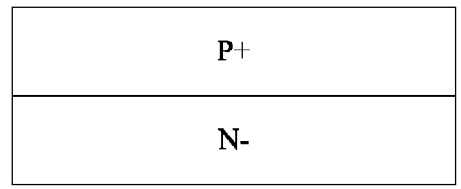
FIG. 1 is a cross-sectional view of a prior art photovoltaic cell.

A conventional prior art photovoltaic cell includes a p-n diode; an example is shown in FIG. 1. A depletion zone forms at the p-n junction, creating an electric field. Incident photons will knock electrons from the conduction band to the valence band, creating free electron-hole pairs. Within the electric field at the p-n junction, electrons tend to migrate toward the n region of the diode, while holes migrate toward the p region, resulting in current. This current can be called the photocurrent. Typically the dopant concentration of one region will be higher than that of the other, so the junction is either a p+/n- junction (as shown in FIG. 1) or a p-/n+ junction. The more lightly doped region is known as the base of the photovoltaic cell, while the more heavily doped region is known as the emitter. Most carriers are generated within the base, and it is typically the thickest portion of the cell. The base and emitter together form the active region of the cell.

Conventional photovoltaic cells are formed from monocrystalline, polycrystalline, or multicrystalline silicon. A monocrystalline silicon wafer, of course, is formed of a single silicon crystal, while the term multicrystalline typically refers to semiconductor material having crystals that are on the order of a millimeter in size. Polycrystalline semiconductor material has smaller grains, on the order of a thousand angstroms. Monocrystalline, multicrystalline, and polycrystalline material is typically entirely or almost entirely crystalline, with no or almost no amorphous matrix. For example, non-deposited semiconductor material is at least 80 percent crystalline.

Photovoltaic cells fabricated from substantially crystalline material are conventionally formed of wafers sliced from a silicon ingot. Current technology does not allow wafers of less than about 150 microns thick to be fabricated into cells economically, and at this thickness a substantial amount of silicon is wasted in kerf, or cutting loss. Silicon solar cells need not be this thick to be effective or commercially useful. A large portion of the cost of conventional solar cells is the cost of silicon feedstock, so decreasing the thickness of a photovoltaic cell may reduce cost.

Figure 2A:
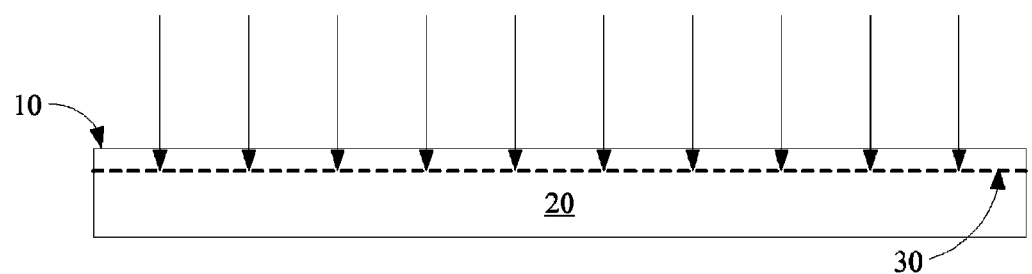
FIGS. 2a-2d are cross-sectional views illustrating stages in formation of an embodiment of Sivaram et al., U.S. patent application Ser. No. 12/026,530.
Figure 2B:
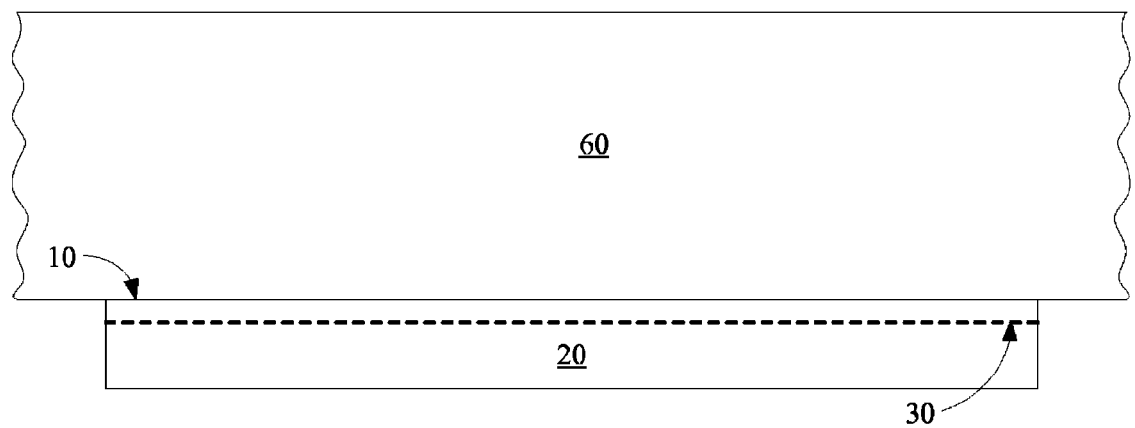
Figure 2C:
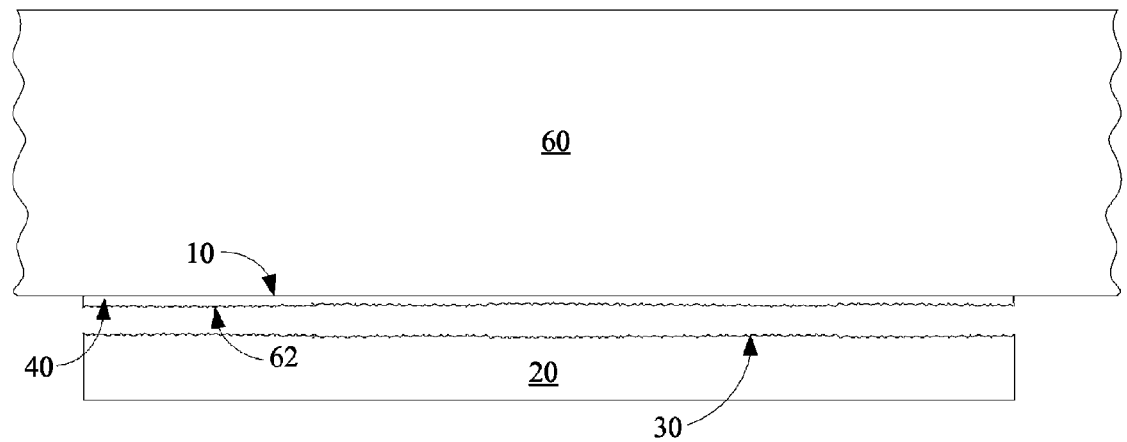
Figure 2D:
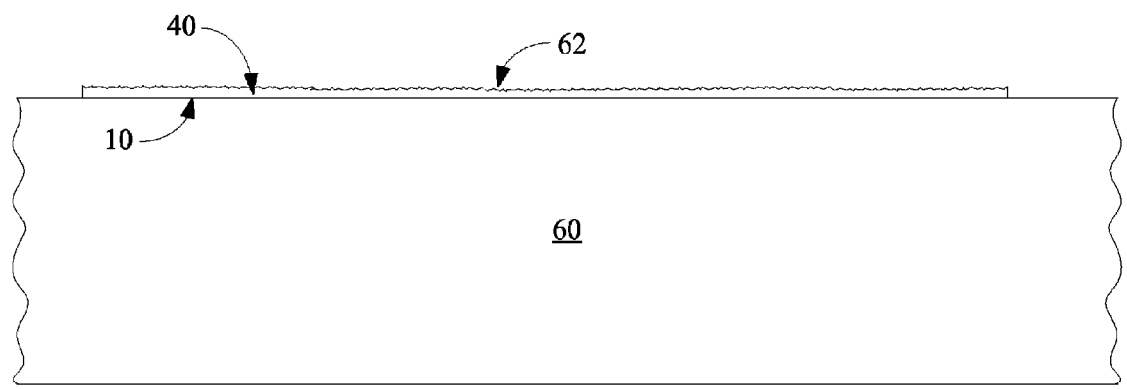

Sivaram et al., U.S. patent application Ser. No. 12/026,530, "Method to Form a Photovoltaic Cell Comprising a Thin Lamina," filed Feb. 5, 2008, owned by the assignee of the present application and hereby incorporated by reference, describes fabrication of a photovoltaic cell comprising a thin semiconductor lamina formed of crystalline, non-deposited semiconductor material. Referring to FIG. 2a, in embodiments of Sivaram et al., a semiconductor donor wafer 20 is implanted with one or more species of gas ions, for example hydrogen or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is less than 100 microns thick, generally between about 0.2 and about 100 microns thick, for example between about 0.2 and about 50 microns, for example between about 1 and about 50 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Hemer, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference, hereinafter the '265 application.

Using the methods of Sivaram et al., photovoltaic cells are formed of thinner semiconductor laminae without wasting silicon through kerf loss or by formation of an unnecessarily thick wafer, thus reducing cost. The same donor wafer can be reused to form multiple laminae, further reducing cost, and may be resold after exfoliation of multiple laminae for some other use. The cost of the hydrogen or helium implant may be kept low by methods described in Parrill et al., U.S. patent application Ser. No. 12/122,108, "Ion Implanter for Photovoltaic Cell Fabrication," owned by the assignee of the present application, filed May 16, 2008, and hereby incorporated by reference.

Conventional crystalline cells may be 200 or 300 microns thick. When the cell is exposed to sunlight, most free charge carriers are generated in the first 10 microns of the light-facing surface of the cell. In conventional crystalline cells formed from wafers, then, the p-n junction is generally formed at or near the front of the cell, so that most of the minority carriers generated in the base will have a short distance to travel to the emitter, where they are collected and thus create photocurrent. If the junction were formed at the rear of such thick cells, minority carriers generated at the front of the cell would recombine before reaching the emitter, and thus not generate photocurrent. Such back-junction cells have been produced on thicker silicon wafers, but they require very pure, very expensive material with high lifetimes.

Along with the emitter region created at the front of the cell, a heavily doped region is also generally created at the back of the cell, to improve ohmic contact to the cell. Using conventional techniques, this cell structure is readily achieved: The wafer is doped as desired on both sides, then affixed to a substrate or superstrate once all high-temperatures steps are complete.

Referring to FIG. 2d, in many embodiments of Sivaram et al., heavily doped regions are also formed both at first surface 10 and at second surface 62 of the photovoltaic cell, in order to define a p-n junction and to provide ohmic contact to the cell. In embodiments of Sivaram et al., the donor wafer is affixed to receiver 60 before exfoliation so that receiver 60 will provide mechanical support to thin lamina 40 during and after exfoliation. Doping of second surface 62, which is created by exfoliation, thus typically takes place after bonding to receiver 60. Formation of a heavily doped region at second surface 62 generally requires a high-temperature step to introduce and activate the dopant.

Exposing lamina 40 to a high-temperature step while it is bonded to receiver 60 entails the risk of damage to receiver 60, damage to the bonding itself, and of potential contamination to the semiconductor lamina by the bonding material. Careful selection of receiver and bonding materials will reduce or eliminate this risk.

In the present invention, this risk is avoided by forming the p-n junction at the back of the cell, at first surface 10 which is bonded to receiver 60. Since lamina 40 is less than 100 microns thick, and typically less than about 10 microns thick, for example two microns thick or less, photogenerated minority carriers in the base do not have far to travel to be collected at the emitter, even when this emitter is formed at the back of the cell. In fact, because any carriers generated in a heavily doped region formed at the front of the cell will tend to recombine immediately, moving the junction to the back of the cell, into a zone in which fewer carriers are generated, may provide an efficiency advantage. Doping at first surface 10 can be performed before bonding to receiver 60.

With the p-n junction already formed, a variety of strategies may be employed to avoid exposing lamina 40 and receiver element 60 to any additional high-temperature steps, such as diffusion doping. It is preferred to avoid formation of a front surface field (FSF), which would require such a doping step. As will be described, a very fine, very tightly spaced grid can be formed contacting second surface 62 with no FSF at this surface. Alternatively, low-temperature methods may be employed to form doped regions very locally, only where wiring contacts front surface 62. In other embodiments, a cell is formed having decreased base resistivity, which will allow ohmic contact to be made to the cell with no FSF and with more conventional spacing of grid lines.

Note this discussion describes embodiments in which second surface 62 is the front, light-facing surface of the cell, while first surface 10 is the back surface. Other arrangements are possible, as described in Sivaram et al. and the '265 application. For example, receiver element 60 may be transparent and serve as a superstrate. In this case first surface 10, which is bonded to receiver element 60, would be the front surface of the cell, while second surface 62 is the back surface.

For clarity, several examples of fabrication of a lamina having thickness less than 100 microns, where the lamina comprises, or is a portion of, a photovoltaic cell according to embodiments of the present invention, will be provided. For completeness, many materials, conditions, and steps will be described. It will be understood, however, that many of these details can be modified, augmented, or omitted while the results fall within the scope of the invention. In these embodiments, it is described to cleave a semiconductor lamina by implanting gas ions and exfoliating the lamina. Other methods of cleaving a lamina from a semiconductor wafer could also be employed in these embodiments.

Example: Dense Grid Spacing, No or Localized FSF

The process begins with a donor body of an appropriate semiconductor material. An appropriate donor body may be a monocrystalline silicon wafer of any practical thickness, for example from about 300 to about 1000 microns thick. In alternative embodiments, the wafer may be thicker; maximum thickness is limited only by practicalities of wafer handling. Alternatively, polycrystalline or multicrystalline silicon may be used, as may microcrystalline silicon, or wafers or ingots of other semiconductors materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. The donor wafer is preferably at least 80 percent crystalline, and in general will be entirely crystalline.

The process of forming monocrystalline silicon generally results in circular wafers, but the donor body can have other shapes as well. Cylindrical monocrystalline ingots are often machined to an octagonal cross section prior to cutting wafers. Multicrystalline wafers are often square. Square wafers have the advantage that, unlike circular or hexagonal wafers, they can be aligned edge-to-edge on a photovoltaic module with no unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 3A:
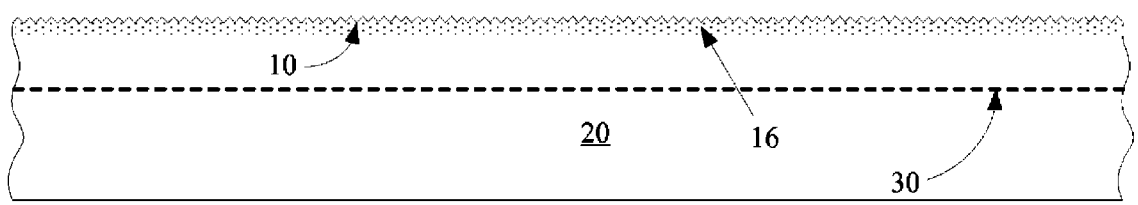
FIGS. 3a-3e are cross-sectional views showing stages in formation of a photovoltaic cell formed according to an embodiment of the present invention.

Referring to FIG. 3a, donor wafer 20 is formed of monocrystalline silicon which is lightly to moderately doped to a first conductivity type. The present example will describe a relatively lightly n-doped wafer 20 but it will be understood that in this and other embodiments the dopant types can be reversed. Dopant concentration may be between about $1 \times 10^{14}$ and $3 \times 10^{18}$ atoms/cm$^3$; for example between about $2 \times 10^{15}$ and $7 \times 10^{15}$ atoms/cm$^3$; for example about $5 \times 10^{15}$ atoms/cm$^3$. Desirable resistivity for n-type silicon may be, for example, between about 44 and about 0.005 ohm-cm, preferably about 2.5 to about 0.7 ohm-cm, for example about 1.0 ohm-cm. For p-type silicon, desirable resistivity may be between about 133 and about 0.01 ohm-cm, preferably between about 7 and about 2 ohm-cm, for example about 2.8 ohm-cm.

First surface 10 is optionally treated to produce surface roughness, for example, to produce a Lambertian surface. The ultimate thickness of the lamina limits the achievable roughness. In conventional silicon wafers for photovoltaic cells, surface roughness, measured peak-to-valley, is on the order of a micron. In embodiments of the present invention, the thickness of the lamina may be between about 0.2 and about 100 microns. Preferred thicknesses include between about 1 and about 80 microns; for example, between about 1 and about 20 microns or between about 2 and about 20 microns. Practically, any thickness in the range between about 0.2 and about 100 microns is achieveable; advantageous thicknesses may be between about 1 and about 1.5, 2, 3, 5, 8, 10, 20, or 50 microns.

If the final thickness is about 2 microns, clearly surface roughness cannot be on the order of microns. For all thicknesses, a lower limit of surface roughness would be about 500 angstroms. An upper limit would be about a quarter of the film thickness. For a lamina 1 micron thick, surface roughness may be between about 600 angstroms and about 2500 angstroms. For a lamina having a thickness of about 10 microns, surface roughness will be less than about 25000 angstroms, for example between about 600 angstroms and 25000 angstroms. For a lamina having a thickness of about 20 microns, surface roughness may be between about 600 angstroms and 50000 angstroms.

Surface roughness may be random or may be periodic, as described in "Niggeman et al., "Trapping Light in Organic Plastic Solar Cells with Integrated Diffraction Gratings," Proceedings of the 17$^{th}$ European Photovoltaic Solar Energy Conference, Munich, Germany, 2001. Formation of surface roughness is described in further detail in Petti, U.S. patent application Ser. No. 12/130,241, "Asymmetric Surface Texturing For Use in a Photovoltaic Cell and Method of Making," filed May 30, 2008, owned by the assignee of the present application and hereby incorporated by reference.

Next, first surface 10 is doped, for example by diffusion doping. First surface 10 will be more heavily doped to the conductivity type opposite that of original wafer 20. In this instance, donor wafer 20 is n-type, so first surface 10 is doped with a p-type dopant, forming heavily doped p-type region 16. Doping may be performed with any conventional p-type donor gas, for example $B_2H_6$ or $BCl_3$. Doping concentration may be, for example, between about $1 \times 10^{18}$ and $1 \times 10^{21}$ atoms/cm$^3$, for example about $1.5 \times 10^{20}$ atoms/cm$^3$.

Next, ions, preferably hydrogen or a combination of hydrogen and helium, are implanted to define a cleave plane 30, as described earlier. Note that the plane of maximum distribution of implanted ions, and of implant damage, is conformal. Any irregularities at first surface 10 will be reproduced in cleave plane 30. Thus, in some embodiments if first surface 10 is roughened, it may be preferred to roughen surface 10 after the implant step rather than before. Once the implant has been performed, exfoliation will occur once certain conditions, for example elevated temperature, are encountered. It is necessary, then, to keep processing temperature and duration below those which will initiate exfoliation until exfoliation is intended to take place.

Figure 3B:
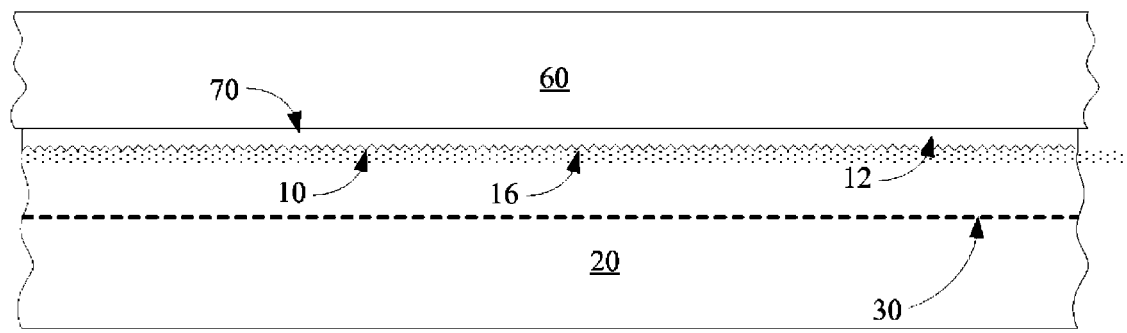

Turning to FIG. 3b, next conductive layer 12 is formed on first surface 10. In most embodiments, layer 12 is also reflective. Silver may be an appropriate material. Other alternatives for such a layer, in this and other embodiments, include aluminum, titanium, chromium, molybdenum, tantalum, zirconium, vanadium, indium, cobalt, antimony, or tungsten, or alloys thereof. In some embodiments, it may be preferred to deposit a thin layer 12 of silver onto first surface 10, though conductive layer 12 may be formed by any appropriate method.

Figure 3C:
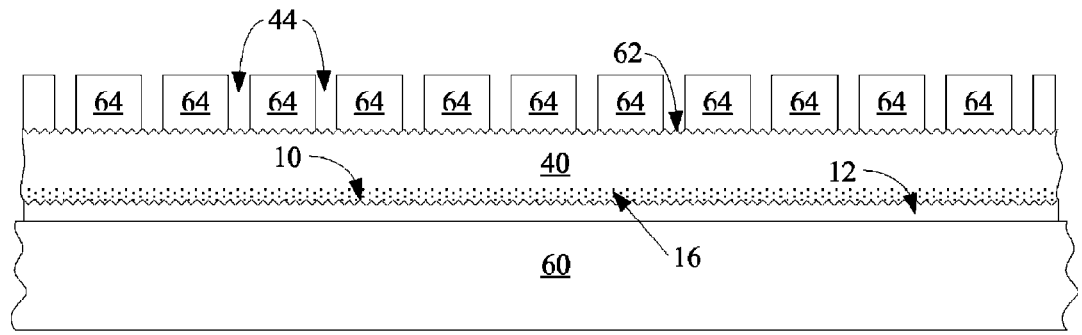

The surface of layer 12 is cleaned of foreign particles, then affixed to receiver element 60. In alternative embodiments, layer 12 may have been formed on receiver element 60, rather than on first surface 10 of donor wafer 20. Receiver element 60 is any appropriate material, for example metal, glass, plastic, etc. As shown in FIG. 3c, lamina 40 can now be cleaved from donor wafer 20 at cleave plane 30 as described earlier. FIG. 3c shows the structure with receiver element 60 on the bottom, as during normal operation once fabrication has been completed. Lamina 40 remains affixed to receiver element 60 with conductive layer 12 disposed between them, as described in Herner et al., U.S. patent application Ser. No. 12/057,274, "A Photovoltaic Assembly Including a Conductive Layer Between a Semiconductor Lamina and a Receiver Element," filed Mar. 27, 2008, owned by the assignee of the present application, hereinafter the '274 application and hereby incorporated by reference. Second surface 62 has been created by exfoliation. As has been described, some surface roughness is desirable to increase light trapping within lamina 40 and improve conversion efficiency of the photovoltaic cell. The exfoliation process itself creates some surface roughness at second surface 62. In some embodiments, this roughness may alone be sufficient. In other embodiments, surface roughness of second surface 62 may be modified or increased by some other known process, such as a wet or dry etch, or by the methods described by Petti, as may have been used to roughen first surface 10.

The implant step used to create the cleave plane will produce some damage to the crystalline structure of the lamina. This damage will be most extensive at the end of the range of implanted ions. This damaged area will thus be at or near second surface 62. This damaged area could cause excessive recombination of photogenerated carriers, as well as forming a layer that is difficult to electrically contact with a low enough resistance. This damaged layer could be repaired by high-temperature annealing, but, as explained, it is preferred to avoid high-temperature processing at this point. Alternatively, the damaged layer could be etched off, for example, in a solution of $HF:H_2C_3O_2:HNO_3$ in a ratio of 2:5:15 for about 3-5 sec. Such an etching step would remove about 0.25 microns of silicon, which should contain all of the damaged material for a typical cleaving implant.

A transparent dielectric layer 64 is formed on second surface 62. If, as in the present embodiment, the body of lamina 40 is lightly doped n-type, then dielectric layer 64 is preferably silicon nitride, for example formed by plasma-enhanced chemical vapor deposition. Silicon nitride also serves as an antireflective coating (ARC). Dielectric layer 64 may be between about 500 and 2000 angstroms thick, for example about 650 angstroms.

Next trenches 44 are opened in silicon nitride layer 64, for example by laser ablation. Trenches 44 are between about 10 and about 50 microns wide, for example between about 10 and about 15 or 20 microns wide. The pitch of trenches 44 is preferably between about 200 and about 1500 microns, for example between about 200 and about 800 microns, for example about 400 microns. The pitch and width of the lines will be adjusted to account for the material used to form wiring, the expected current from the cell, etc., as will be understood by those skilled in the art.

Figure 3D:
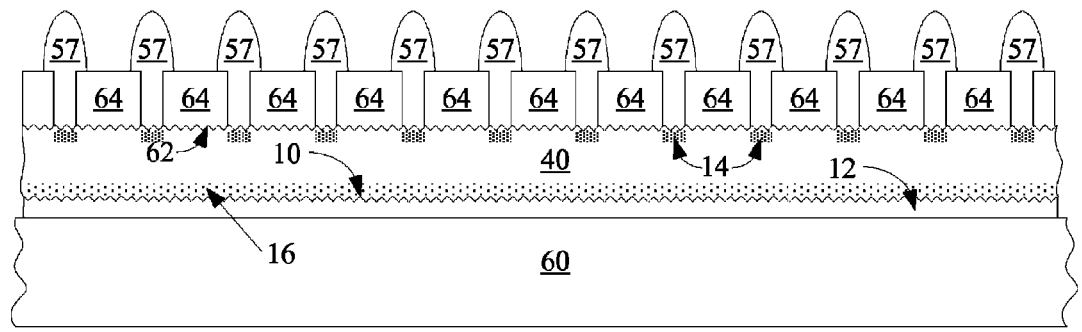

Turning to FIG. 3d, next a source of an n-type dopant such as a phosphorus dopant, for example phosphoric acid or phosphorus pentoxide, is formed on the regions of second surface 62 exposed in trenches 44, for example by screenprinting, aerosol printing, or inkjet printing. By passing a laser beam over the exposed regions of surface 62, these regions 14 are locally heavily n-doped. Laser heating of lamina 40 will be very local, typically only tens of nanometers deep, and is achieved without subjecting receiver element 60 or the body of lamina 40 to a high-temperature step. It will be understood that FIG. 3d is not to scale, and heavily doped regions 14 are much thinner than as depicted. In general heavily doped regions 14 will be no more than ten percent of the surface area of second surface 62. It may be preferred for any remaining undiffused dopant to be rinsed off with deionized water followed by a quick buffered oxide etch to remove any phosphosilicate glass that may have formed, preferably followed by an additional rinse in dionized water.

Next wiring is formed in trenches 44 (shown in FIG. 3c). Formation of a very thin nickel seed layer (not shown) on the exposed regions of second surface 62 is followed by electroplating of copper, or, for example, conventional or light-induced plating of either silver or copper. These plating methods selectively deposit the metal, forming wiring 57. The thickness of wiring 57 will be selected to produce the desired resistance, and may be, for example, about 7 to 10 microns.

In this embodiment, silicon nitride was selected for deposition on second surface 62 for several reasons. Silicon nitride generally is naturally positively charged. In the cell described in this embodiment, when the cell is exposed to light, excess holes and electrons are generated throughout the cell, but especially near the light-facing surface 62. If the interface at this surface contains a high density of trapping sites, many or most of the photogenerated electrons and holes will recombine at this surface and thus will create little or no photocurrent. The positive charge of silicon nitride layer 64 tends to repel holes from this surface. Thus, even with a high density of interface traps, there will be few holes with which electrons can recombine, allowing them to be more readily collected by wiring 57. Alternatively, in other embodiments, other ARCs may be used.

Figure 3E:
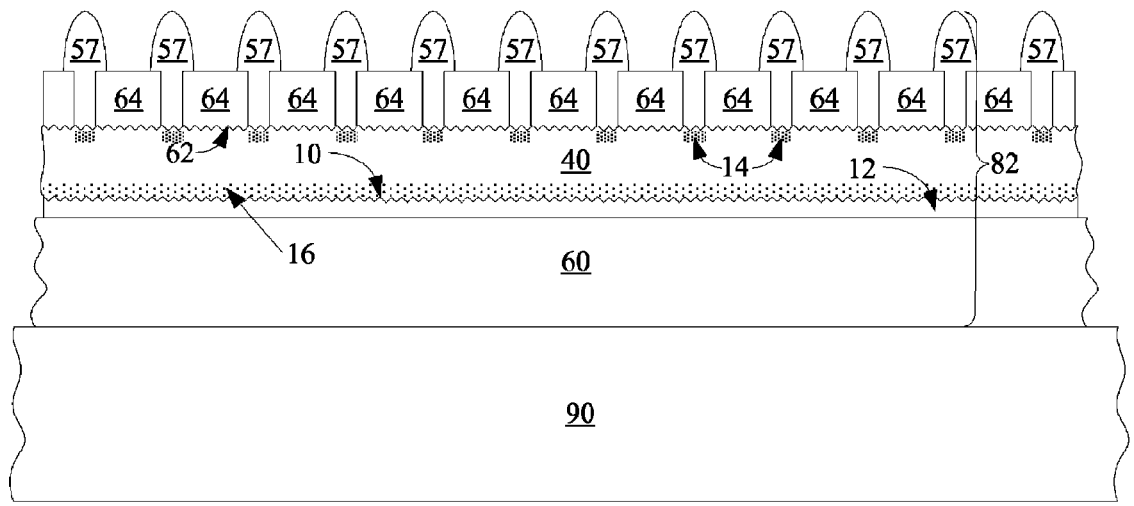

Next, turning to FIG. 3e, photovoltaic assembly 82, which comprises lamina 40 and receiver element 60, is affixed to a substrate 90, or to a superstrate, along with a plurality of other photovoltaic assemblies 82. Each photovoltaic assembly 82 comprises a photovoltaic cell. The photovoltaic cells are electrically connected in series, forming a completed photovoltaic module.

Many variations are possible. In some embodiments, thin stripes of an n-type dopant can be formed on second surface 62, for example by inkjet printing, before deposition of silicon nitride layer 64; in this case the laser ablation step that opens trenches 44 can also serve to dope regions of second surface 62 and activate the dopant. In other embodiments, deposition of a dopant source on the surface and the laser doping step can be omitted, and no portion of second surface 62 will be doped.

Figure 4A:
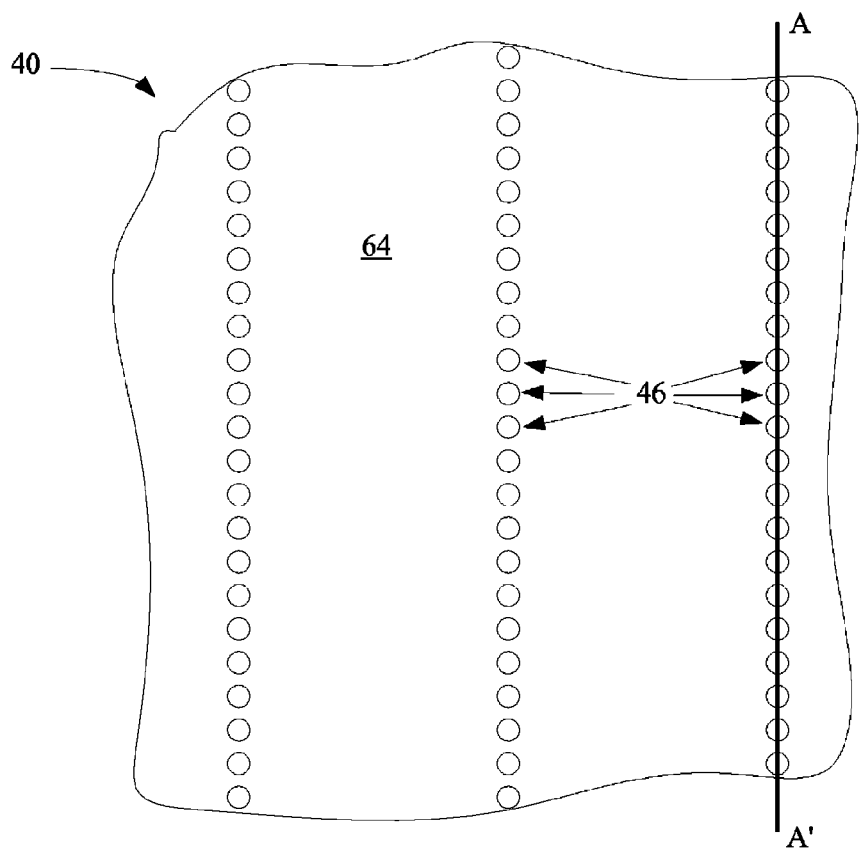
FIGS. 4a and 4b show an alternative embodiment of the present invention, the embodiment having dense contacts at its front surface.
Figure 4B:
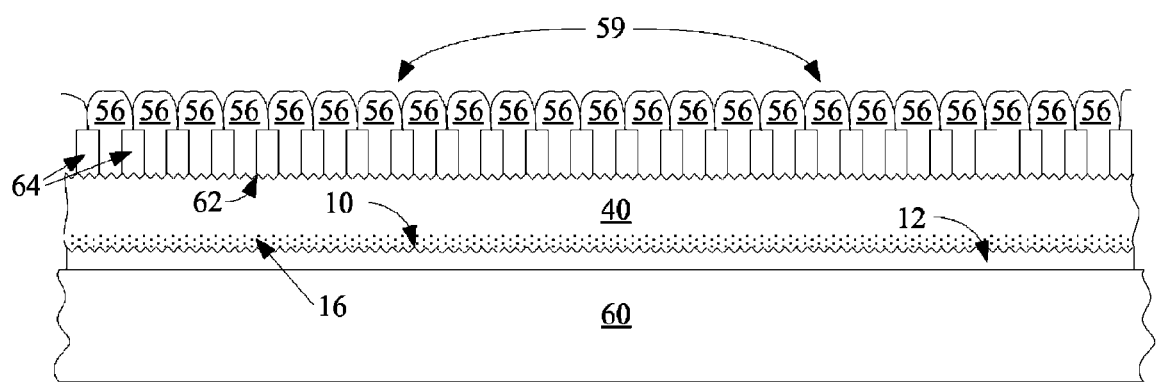

Referring to FIG. 4a, which shows a portion of lamina 40 in plan view, in another alternative, laser ablation can be used to form holes 46 rather than trenches in silicon nitride layer 64. Each hole may be, for example, about 10 microns in diameter, and the pitch of the holes in one dimension can be, for example, about 20 microns. Referring to FIG. 4b, which shows the same structure in cross-section along line A-A', after optional laser doping in each hole, contact 56 is formed in each hole by formation of a nickel seed layer and silver or copper electroless plating, as described earlier. Above the surface of silicon nitride layer 64, contacts 56 will be larger than the 10 micron holes in which they are formed, and spacing can be selected so that adjacent contacts 56 merge, forming a single gridline 59. Gridline spacing can be between about 200 and about 1500 microns, for example between about 400 and about 800 microns, for example about 500 microns. Note that drawings are not to scale.

In this and other embodiments, polarity can be reversed. If the original donor wafer is p-type, first surface 10 will be doped heavily n-type, and a negatively charged dielectric such as alumina may be formed on second surface 62 to passivate the surface. Alumina is not an effective ARC, so in this case the layer of alumina may be relatively thin, for example between about 10 and about 30 nm, while an additional thickness, for example about 200 nm, of, for example, silicon oxide formed on the alumina serves as an ARC. Alternatively, the ARC may be about 70 nm of titanium oxide, or a stack of about 10 nm of silicon oxide on the alumina, and about another 60 nm of silicon nitride on the silicon oxide.

Summarizing, what has been described is a photovoltaic cell comprising a semiconductor lamina, the semiconductor lamina having a front surface and a back surface, and wherein incident light enters the semiconductor lamina at the front surface during normal operation of the photovoltaic cell. In embodiments of this cell, the body of the semiconductor lamina is lightly to moderately doped to a first conductivity type, the back surface of the semiconductor lamina is heavily doped to a second conductivity type opposite the first conductivity type, and no more than ten percent of the surface area of the front surface of the semiconductor lamina is doped more heavily to the first conductivity type than the lamina body. The front surface may comprise a plurality of discrete more heavily doped regions of the first conductivity type, each of which is in contact with conductive material such as wiring. In some instances, none of the front surface is heavily doped. Generally within about 300 nm of the front surface of the semiconductor lamina, no portion of the semiconductor lamina has a dopant concentration greater than about $1\times10^{19}$ atoms/cm$^3$.

As described, the photovoltaic cell may be formed by providing a donor wafer doped to a first conductivity type; doping a first surface of the donor wafer to a second conductivity type opposite the first conductivity type; defining a cleave plane within the donor wafer; affixing the first surface of the donor wafer to a receiver element; cleaving a semiconductor lamina from the donor wafer at the cleave plane wherein the semiconductor lamina remains affixed to the receiver element; and completing fabrication of the photovoltaic cell, wherein the photovoltaic cell comprises the semiconductor lamina. The cleaving step may create a second surface of the semiconductor lamina substantially parallel to the first surface, and fabrication of the photovoltaic cell is completed by forming localized areas of dopant on the second surface, and applying laser energy to the second surface to form heavily doped regions of the semiconductor lamina adjacent to the localized areas.

Example: Low Base Resistivity

In the prior example, no FSF or only a localized FSF was formed, and in some embodiments, the resistivity of the base region (the lightly doped portion of the photovoltaic cell) was in a conventional range. In a conventional photovoltaic cell, base resistivity may be between about 0.7 and about 2.5 ohm-cm. The inventors of the present invention have found that in embodiments of the present invention, base resistivity can be reduced significantly without degradation of conversion efficiency, and in some cases some improvement. When base resistivity is lower, it is expected that there will be less need for localized doping beneath the electrical contacts of the front surface to reduce contact resistance, thus simplifying fabrication.

In the prior example, to compensate for the lack of an FSF, grid spacing was tighter than in conventional photovoltaic cells. When base resistivity is reduced, for example to less than about 0.5 ohm-cm, for example between about 0.005 ohm-cm and about 0.1 ohm-cm, for example between about 0.01 ohm-cm and 0.05 ohm-cm, gridline spacing can be wider, for example about 1200 microns rather than 500 microns or less. This would result in less shading of the light incident on the cell, yielding a higher efficiency. It could also allow the use of wider contacts and metal fingers, possibly reducing the cost of the fabrication process. Further, with a lower base resistivity, localized doping of the front surface adjacent to electrical contacts can more readily be reduced or omitted.

Referring to FIG. 3c in the previous example, the width of trenches 44, and thus the width of wiring 57 shown in FIG. 3d, was, for example, between about 10 and about 50 microns. With lower base resistivity, these trenches will be farther apart, and may also be wider, for example between about 10 and about 100 microns, in some embodiments between about 30 and about 80 microns, for example 60 or 65 microns.

Thus in various embodiments of the present invention, a photovoltaic cell may be fabricated by starting with a donor wafer having the lower resistivity just described. Fabrication begins with a lightly doped donor wafer of a first conductivity type. A first surface of the donor wafer is doped to a second conductivity type, opposite the first. This first surface will be the back surface of the photovoltaic cell, and the p–n junction has just been formed by this doping step. One or more species of gas ions is implanted through the first surface, defining a cleave plane. The first surface of the donor wafer is affixed to a receiver element, with electrical contact formed between them, for example by an interposed metal layer. A thin semiconductor lamina is formed by cleaving from the donor wafer at the cleave plane as has been described. The second surface of the cell, formed by exfoliation, will be the light-facing surface of the lamina. This second surface is passivated by any of the means described, for example by deposition of an appropriately charged dielectric. Electrical contact is formed to the front surface, completing the photovoltaic cell.

Summarizing, a photovoltaic cell according to embodiments of the present invention may be formed by providing a donor wafer doped to a first conductivity type, wherein the resistivity of the donor wafer is less than about 0.5 ohm-cm; defining a cleave plane within the donor wafer; affixing the first surface of the donor wafer to a receiver element; cleaving a semiconductor lamina from the donor wafer at the cleave plane wherein the semiconductor lamina remains affixed to the receiver element; and completing fabrication of the photovoltaic cell, wherein the photovoltaic cell comprises the semiconductor lamina.

Formation has been described of a photovoltaic cell comprising a semiconductor lamina which in turn comprises a base region. The base region comprises at least a portion of a base of the photovoltaic cell, wherein the resistivity of the base region of the semiconductor lamina is less than about 0.5 ohm-cm, and wherein the semiconductor lamina has a thickness less than about 50 microns. As in other embodiments, the lamina may be significantly thinner, for example 20 microns, 5, microns, 2 microns, or less. The resistivity of the base region may be between about 0.005 and 0.5 ohm-cm.

In some embodiments, the p–n junction is at the back of the cell. This surface was the first surface, which was bonded to the receiver element. Thus, in these embodiments the semiconductor lamina has a front surface and a back surface, wherein incident light enters the semiconductor lamina at the front surface during normal operation of the photovoltaic cell, wherein the semiconductor lamina comprises a p–n or n–p junction of the photovoltaic cell, and wherein the p–n or n–p junction of the photovoltaic cell is nearer to the back surface of the lamina than to the front surface of the lamina. Within about 300 nm of the back surface of the lamina, the peak dopant concentration is greater than about $1\times10^{19}$ atoms/cm$^3$.

As has been described, embodiments of the photovoltaic cell of the present invention have no FSF. Thus in these embodiments, the portion of the semiconductor lamina within 300 nm of the front surface has substantially the same resistivity as the resistivity of the base region of the semiconductor lamina.

Example: Amorphous FSF

Figure 5:
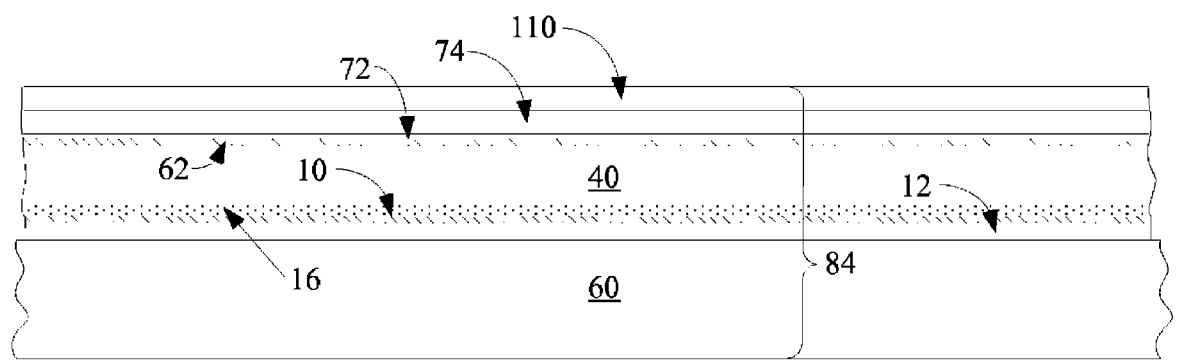
FIG. 5 is a cross-sectional view of another embodiment of the present invention.

In another embodiment, the surface created by exfoliation is passivated by amorphous silicon. Turning to FIG. 5, fabrication begins as in prior embodiments, with a lightly doped donor wafer (not shown) of a first conductivity type, for example n-type. Its first surface 10 is doped, for example by diffusion doping, to a second conductivity type opposite the first, for example p-type, forming heavily doped p-type region 16, and forming the p–n junction. After implantation of one or more species of gas ions, for example hydrogen and/or helium, to define a cleave plane, first surface 10 is affixed to receiver element 60 with a conductive layer 12 disposed between them. A semiconductor lamina 40 is cleaved from the donor wafer at the cleave plane, creating second surface 62.

Next a very thin intrinsic amorphous silicon layer 72 is deposited on second surface 12, followed by a heavily doped amorphous silicon layer 74 of the first conductivity type, in this example heavily doped n-type. Heavily doped amorphous layer 74 serves as an FSF. This layer can be deposited at relatively low temperature. Next transparent conductive oxide (TCO) 110 is formed on heavily doped amorphous layer 74. Appropriate materials for TCO 110 include aluminum-doped zinc oxide, as well as indium tin oxide, tin oxide, titanium oxide, etc.; this layer may serve as both a top electrode and an antireflective layer. In alternative embodiments, an additional antireflective layer may be formed on top of TCO 110. Wiring can be formed on TCO 110, and, as in prior embodiments, photovoltaic assembly 84 just fabricated can be affixed to a substrate or superstrate. Each photovoltaic assembly comprises a photovoltaic cell, and the photovoltaic cells are preferably electrically connected in series, forming a photovoltaic module.

Any of the fabrication methods described herein can be combined, and further can be combined with any of the fabrication methods described in Sivaram et al., the Hemer et al. application filed on even date herewith, or any of the other incorporated applications. A variety of embodiments has been provided for clarity and completeness. Clearly it is impractical to list all embodiments. Other embodiments of the invention will be apparent to one of ordinary skill in the art when informed by the present specification.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for making a photovoltaic cell, the method comprising:
    providing a donor wafer doped to a first conductivity type;
    doping a first surface of the donor wafer to a second conductivity type opposite the first conductivity type;
    defining a cleave plane within the donor wafer;
    affixing the first surface of the donor wafer to a receiver element wherein a reflective metal layer is disposed between the receiver element and the donor wafer;
    cleaving a semiconductor lamina from the donor wafer at the cleave plane wherein the semiconductor lamina remains affixed to the receiver element, and the lamina comprises a second surface opposite the first surface; and
    completing fabrication of the photovoltaic cell, wherein the photovoltaic cell comprises the semiconductor lamina;
    wherein the first surface comprises an emitter region of the photovoltaic cell, and wherein the second surface is a light facing surface of the lamina.

2. The method of claim 1, wherein the semiconductor lamina has a thickness, measured perpendicular to the receiver element, less than about 80 microns.

3. The method of claim 2, wherein the thickness of the semiconductor lamina is between about 0.2 and about 5 microns.

4. The method of claim 1, wherein the donor wafer is substantially at least one of monocrystalline, polycrystalline, and multicrystalline silicon.

5. The method of claim 1, wherein the step of defining the cleave plane comprises implanting one or more species of gas ions through the first surface.

6. The method of claim 5, wherein the one or more species of gas ions comprise at least one of hydrogen and helium ions.

7. The method of claim 1, wherein the step of completing fabrication of the photovoltaic cell comprises forming localized areas of dopant on the second surface, and applying laser energy to the second surface to form heavily doped regions of the semiconductor lamina adjacent to the localized areas.

* * * * *

UNITED STATES PATENT AND TRADEMARK OFFICE
CERTIFICATE OF CORRECTION

| | |
|---|---|
| PATENT NO. | : 8,338,209 B2 |
| APPLICATION NO. | : 12/189158 |
| DATED | : December 25, 2012 |
| INVENTOR(S) | : Mohamed M. Hilali et al. |

It is certified that error appears in the above-identified patent and that said Letters Patent is hereby corrected as shown below:

In the Claims

In column 12, line 7, please insert --, wherein the step of doping of the first surface occurs before the step of defining the cleave plane-- after "wafer".

Signed and Sealed this
Sixteenth Day of December, 2014

Michelle K. Lee
*Deputy Director of the United States Patent and Trademark Office*